United States Patent
Chiu et al.

(10) Patent No.: US 6,734,567 B2
(45) Date of Patent: May 11, 2004

(54) FLIP-CHIP DEVICE STRENGTHENED BY SUBSTRATE METAL RING

(75) Inventors: Tz-Cheng Chiu, Plano, TX (US); Mohammad Yunus, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/226,415

(22) Filed: Aug. 23, 2002

(65) Prior Publication Data

US 2004/0036179 A1 Feb. 26, 2004

(51) Int. Cl.[7] .................. H01L 23/48; H01L 23/52; H01L 23/29
(52) U.S. Cl. .............. 257/778; 257/688; 257/737; 257/783; 257/788; 257/792; 257/795
(58) Field of Search ................ 257/669–671, 257/673, 674, 685–688, 701, 737, 738, 777–784, 788, 789, 792, 795; 438/570

(56) References Cited

U.S. PATENT DOCUMENTS

| | | | |
|---|---|---|---|
| 3,716,764 A | | 2/1973 | Birchler et al. |
| 4,034,027 A | | 7/1977 | Smith, Jr. |
| 5,612,576 A | * | 3/1997 | Wilson et al. ............ 257/788 |
| 5,699,027 A | * | 12/1997 | Tsuji et al. ............. 333/193 |
| 6,157,085 A | * | 12/2000 | Terashima ............. 257/783 |
| 6,271,107 B1 | * | 8/2001 | Massingill et al. ....... 438/597 |

OTHER PUBLICATIONS

"Faillure Mechanisms for Epoxy Die Attach Adhesives In Plastic Encapsulated I.C.'s", Justin C. Bolger & Charles T. Mooney, IEEE 33rd Electronic Comp. Conf., pp. 227–231, 1983.
"The Quality of Die–Attachment And Its Relationship To Stresses And Vertical Die–Cracking", C.G.M. van Kessel, S. A. Gee, and J. J. Murphy, 33rd Electronic Comp. Conf., pp. 237–244, 1983.
"SLT Device Metallurgy And Its Monolithic Extension", P.A. Totta & R.P. Sopher, IBM Journal of Research and Development, vol. 13, No. 3, pp. 225–296, May 1969.

* cited by examiner

*Primary Examiner*—Hung Vu
(74) *Attorney, Agent, or Firm*—W. Daniel Swayze, Jr.; W. James Brady; Frederick J. Telecky, Jr.

(57) ABSTRACT

Electronic devices of improved reliability having a substrate of electrically insulating material, further an integrated circuit chip with a periphery and a surface. Using a layer of polymeric material, the chip surface is mounted on the substrate surface. The polymeric material protrudes beyond the chip periphery and spreads some distance along the substrate surface. A metal layer is on the substrate surface, this layer is shaped as a band around the chip periphery; the band has an inner edge near the chip periphery, and an outer edge near the contour of the polymer protrusion. This metal band serves as a guard ring to stop any nascent crack propagating in the polymer protrusion.

5 Claims, 2 Drawing Sheets

FLIP-CHIP DEVICE STRENGTHENED BY SUBSTRATE METAL RING

FIELD OF THE INVENTION

The present invention is related in general to the field of electronic systems and semiconductor devices and more specifically to a flip-chip device thermomechanically strengthened by a guard ring in the substrate.

DESCRIPTION OF THE RELATED ART

One of the main functions of the metal leadframe for integrated circuit (IC) chips (invented in U.S. Pat. Nos. 3,716,764 and 4,034,027) is to provide a stable support pad for firmly positioning the IC chip. The attachment of the chip to this pad is performed by a layer of polymerizable adhesive. Common choices include epoxy-based or polyimide-based adhesives. It has been common practice to apply these adhesives to the leadframe pad at low viscosity so that they can spread out over the pad and will be pressured by the IC chip into a uniform layer with a fillet of excess material protruding from all edges of the chip. As a matter of convenience, this protruding fillet was commonly used an easily visible marker of process control to indicate flawless chip attachment. Some schematic drawings can be found in early literature, for example J. C. Bolger and C. T. Mooney, "Failure Mechanisms for Epoxy Die Attach Adhesives in Plastic Encapsulated IC's", IEEE $33^{rd}$ Electronic Comp. Conf., pp. 227–231, 1983; C. G. M. van Kessel, S. A. Gee, and J. J. Murphy, "The Quality of Die Attachment and its Relationship to Stresses and Vertical Die Cracking", IEEE $33^{rd}$ Electronic Comp. Conf., pp.237–244, 1983.

Much effort of the industry has been dedicated to ensure uniform and void-free application of the chip attach adhesive so that cracks in the adhesive or especially delamination of the chip from the leadframe, caused by thermomechanical stress, would be avoided. No particular attention was paid to the fillet of the attach material, since any crack in or through the fillet did not matter for the electrical performance of a chip attached to a metal leadframe.

Recent trends in packaging have changed this situation. For many device types, especially in the chip-scale families, the chip is attached to a thin plastic film rather than a metallic leadframe. A crack through the fillet can easily continue into the thin plastic substrate and create an electrical short to one of the patterned interconnections integral with the substrate.

Analogous considerations hold for the paradigm shift of modern flip-chip devices compared to the traditional mounting of an integrated circuit chip onto a printed circuit substrate by solder bump interconnections. The integrated circuit chip is spaced apart from the printed circuit substrate by a gap. The solder bump interconnections extend across the gap and connect contact pads on the integrated circuit chip to terminal pads on the printed circuit substrate to attach the chip and then conduct electrical signals, power and ground potential to and from the chip for processing. There is a significant difference between the coefficient of thermal expansion (CTE) between the semiconductor material used for the chip and the material typically used for the substrate; for instance, with silicon as the semiconductor material and plastic FR-4 as substrate material, the difference in CTE is about an order of magnitude.

As a consequence of the CTE difference, mechanical stresses are created when the assembly is subjected to thermal cycling during use or testing. These stresses tend to fatigue the solder bump interconnections, resulting in cracks and thus eventual failure of the assembly. In order to strengthen the solder joints without affecting the electrical connection, the gap is customarily filled with a polymeric material, which encapsulates the bumps and fills any space in the gap between the semiconductor chip and the substrate. A fillet of polymeric material is protruding over the perimeter of the chip to form a meniscus ring around the assembly (see for instance the publications in IBM J. Res. Develop., vol. 13, pp. 226–296, 1969).

The encapsulant is typically applied after the solder bumps are reflowed to bond the integrated circuit chip to the printed circuit substrate. A polymeric precursor, sometimes referred to as the "underfill", is dispensed onto the substrate adjacent to the chip and is pulled into the gap by capillary forces. The precursor is heated, polymerized and "cured" to form the encapsulant. It is well known in the industry that the elevated temperature and the temperature cycling needed for this curing can also create mechanical stresses which can be detrimental to the chip and the solder interconnections. The stresses may delaminate the solder joint, crack the passivation of the chip, or propagate fractures into the circuit structures. The problems are aggravated for devices in which the solder bumps are connecting to a thin plastic film rather than a sturdy circuit board.

An urgent need has therefore arisen for a device design that provides a stress-reduced and crack-safe chip attach and underfill structure as far as the plastic fillet is concerned. The design should be simple and low cost, applicable to any size chip and any chip contour. At the same time, the structure should be flexible to be applied to a wide spectrum of material and process variations, leading to improved semiconductor device reliability. Preferably, these improvements should be accomplished using the installed equipment base so that only little investment in new manufacturing machines is needed.

SUMMARY OF THE INVENTION

The invention describes electronic devices of improved reliability having a substrate of electrically insulating material, further an integrated circuit chip with a periphery and a surface. Using a layer of polymeric material, the chip surface is mounted on the substrate surface. The polymeric material protrudes beyond the chip periphery and spreads some distance along the substrate surface. A metal layer is on the substrate surface, this layer is shaped as a band around the chip periphery; the band has an inner edge near the chip periphery, and an outer edge near the contour of the polymer protrusion. This metal band serves as a guard ring to stop any nascent crack propagating in the polymer protrusion.

In the first embodiment of the invention, the chip surface is the "active" surface including the integrated circuit. Consequently, the mounting is provided by solder bumps between the chip and the substrate, and the polymeric material is the so-called bump "underfill" material.

In the second embodiment of the invention, the chip surface is the "passive" surface opposite the integrated circuit. Consequently, the polymeric material is adhesive and is able to provide the chip mounting by attaching it to the substrate.

It is an aspect of the present invention to provide the metallic guard ring without an additional process step.

Another aspect of the invention is to prevent a nascent crack through the polymer bulge from penetrating into the substrate (and possibly creating an electrical short to one of the patterned metal interconnections), but rather to be stopped by the metal guard ring or to be side-tracked along the substrate surface.

Another aspect of the invention is to drastically reduce the number of failures in semiconductor-packages and flip-chip devices by changing the failure mechanism from a probabilistic weakest-link mode to a parallel-type mode. In known technology, cracks through the polymer bulge, initiated by thermomechanical stress and implied with enough energy, are able to migrate until they find the weakest link in the assembly and break or delaminate the assembly. The failure mechanism is, therefore, controlled by the probability that a nascent crack will find the weakest link.

According to the Griffith energy-balance concept for crack formation in brittle solids (first published in 1920), a change in the length of a nascent crack or notch cannot change the sum of all energies; in other words, the sum of surface energy and mechanical energy has to stay constant. This means for a crack extension that the surface energy may generally increase, but the mechanical energy has to decrease. The mechanical energy itself consists of the sum of the strain potential energy stored in the material and the potential energy of the outer applied loading system. This says, whenever any of these energies can assume a lower value, the freed energy can be invested in generating more surface for an expanding crack.

Applying the Griffith equilibrium requirement to assembly cracks in semiconductor devices, whenever uniform thermomechanical stress is applied (for instance during operation or testing of the semiconductor device) so that it is larger than the failure stress, a nascent crack may propagate spontaneously and without limit—unless it is stopped or arrested. The failure stress at the crack front, in turn, is proportional to the free surface energy per unit area and to Young's modulus (a material constant), and inverse proportional to the length of the starter crack or notch.

Based on the invention, the fabrication of the guard ring metal (copper) structure transforms the polymer volumes into reinforced composites with considerable toughness against fracture and propagation of nascent cracks. The main contribution to this toughness comes from the intrinsic adhesion energies of the components. The toughening is attributable to shielding processes, notably bridging, where the reinforcing phases are left intact as ligaments at the crack interface. Key to attaining effective toughening is the existence of suitably weak interfaces to allow debonding between the polymer and the reinforcing metal structures, and energy dissipation within the ensuing bridges at separation. Even without optimizing the shielding processes, large increases in peak stress and strain to failure have been observed, with the crack resistance energy per unit area increasing up to an order of magnitude.

It is a technical advantage of the invention to provide design and process concepts which are flexible so that they can be applied to many families of semiconductor products, and are general so that they can be applied to several generations of products.

Another advantage of the invention is to use only designs and processes most commonly employed and accepted in the fabrication of IC devices, thus avoiding the cost of new capital investment and using the installed fabrication equipment base.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. Pat. No. 6,365, 958, issued Apr. 2, 2002 (Ibnabdeljalil et al., "Sacrificial Structures for Arresting Insulator Cracks in Semiconductor Devices"), and U.S. patent application Ser. No. 10/178,138, filed Jun. 24, 2002 (Yunus et al., "Contact Structure for Reliable Metallic Interconnection").

Figure 1:
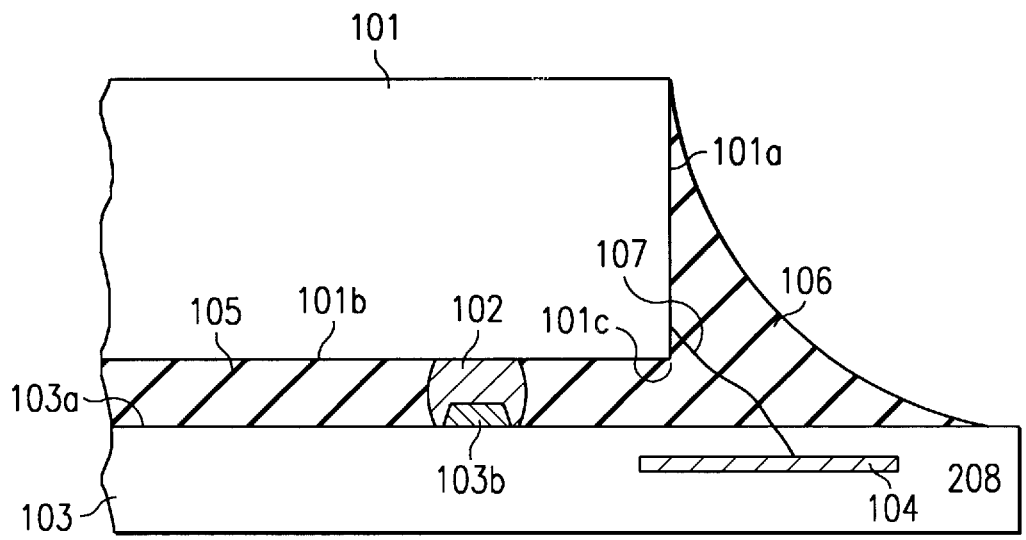
FIG. 1 is a schematic cross section of a portion of an IC chip, flip-chip assembled on a substrate, with the underfill polymer forming a fillet. A crack originates at a high stress region of the chip-fillet interface and propagates through the fillet and portion of the substrate, endangering a patterned metal line in the substrate.

The impact of the present invention can be most easily appreciated by highlighting the shortcomings of the known technology. FIG. 1 shows the simplified and schematic cross section of a portion of an integrated circuit (IC) chip 101, specifically the end portion of the chip with the chip edge 101a. Chip 101, usually silicon, has an "active" surface 101b including the integrated circuit (IC) and the contact pads. A bump/ball 102 of a reflowable metal alloy is attached to each of the contact pads. The bumps/balls serve as interconnection members for assembling chip 101 onto substrate 103 (flip-chip assembly). On the substrate surface 103a of substrate 103 are electrical terminals 103b. The reflowable bumps/balls 102 are attached to the electrical terminals 103b. The terminals 103b serve as electrical entry/exit ports for the patterned interconnecting lines 104, which are integral with substrate 103.

Lines 104 are typically thin (approximately 10 to 30 $\mu$m) copper traces; they are mechanically weak. Lines 104 are embedded in the plastic material of substrate 103. Common materials for substrates 103 are either thin films of polyimide-based plastics, or more rigid boards made of FR-4, FR-5, BT-resin, with or without strengthening or thermally modulating fibers. These materials have coefficients of thermal expansion (CTE) up to 10× higher than silicon, but only limited strength against energy-laden mechanical cracks.

Bumps/balls 102 are commonly made of tin, indium, alloys of tin such as tin/indium, tin/silver, tin/bismuth, and tin/lead, conductive adhesives, or z-axis conductive materials. They may be deposited (evaporated or plated) or made of pre-fabricated "balls". The bumps 102 assume various shapes after attaching the chip to the substrate, influenced by the forces of surface tension during the reflow process. During the assembly and reflow process, and especially during temperature cycling in device operation or device testing (−40 to +125° C.), these bumps come under severe thermomechanical stress due to the large CTE discrepancy between silicon and the substrate.

As a countermeasure, it is common practice to distribute, by capillary forces, a polymeric precursor 105 between the bumps; after polymerization (curing), "underfill" 105 provides some stress relief. "Underfill" materials were first introduced in the C-4 process (see the detailed publications by the International Business Machines Corporation in 1969: IBM J. Res. Develop., Vol. 13, pp. 226–296).

Underfill polymers 105 form fillets 106 at the chip edges 101a. It has been known for a long time that these fillets 106 are exposed to high stress concentrations due to the edge 101a and corners 101c of chip 101; see, for example, K. G. Heinen, "Die Attach Reliability Prediction", 1$^{st}$ Internat. SAMPE Electronics Conf., pp. 264–274, 1987. It is, therefore, a frequent phenomenon that cracks 107 originate at the interface of fillet 106 with the edge 101a or the corner 101c of chip 101. These nascent cracks 107 propagate through the fillet into the substrate material 103. There is a high probability that cracks 107 will reach one of the many interconnecting lines 104, initiating an electrical leakage path or even short. Finally, the thin line 104 will be broken, crack 107 will continue and inflict its full damage in substrate 103, leading eventually to electrical device failure.

Figure 2:
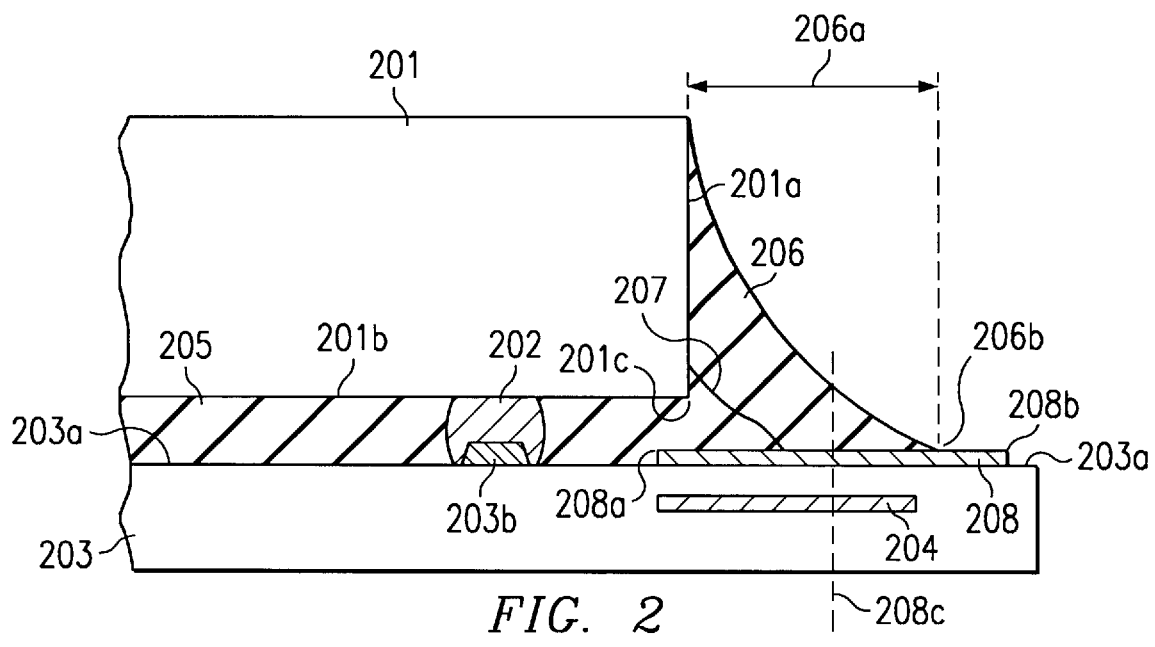
FIG. 2 is a schematic cross section of a portion of an IC chip, flip-chip assembled on a substrate having a metal layer on its surface, structured as a guard ring to stop any crack through the underfill fillet.

FIG. 2 illustrates the first embodiment of the present invention. FIG. 2 shows the simplified and schematic cross section of a portion of an IC chip 201, specifically the end portion of the chip with the chip edge 201a. Chip 201, usually silicon, has an "active" surface 102b including the IC and the contact pads. A bump/ball 202 of a reflowable metal alloy is attached to each of the contact pads. The bumps/balls serve as interconnection members for assembling the chip 201 onto substrate 203 (flip-chip assembly). On the substrate surface 203a of substrate 203 are electrical terminals 203b. The reflowable bumps/balls 202 are attached to the electrical terminals 203b. The terminals 203b serve as electrical entry/exit ports for the patterned interconnecting lines 204, which are integral with substrate 203.

Lines 204 are preferably thin (approximately 5 to 15 $\mu$m) copper traces; they are mechanically weak. Lines 204 are embedded in the plastic material of substrate 203. Preferred materials for substrate 203 are either thin films of polyimide-based plastics, or more rigid boards of FR-4, FR-5, BT-resin, with or without strengthening or thermally modulating fibers. These substrate materials have coefficients of thermal expansion (CTE) approximately 10× higher than silicon. In terms of mechanical strength, the substrate materials offer only limited resistance against energy-laden cracks.

Bumps/balls 202 are commonly made of tin, indium, alloys of tin such as tin/indium, tin/silver, tin/bismuth, and tin/lead, conductive adhesives, or z-axis conductive materials. They may be deposited (evaporated or plated) or made of pre-fabricated "balls". As defined herein, the term solder "ball" does not imply that the solder contacts are necessarily spherical. They may have various forms, such as semispherical, half-dome, truncated cone, or generally bump. The exact shape is a function of the deposition technique (such as evaporation, plating, or prefabricated units) and the reflow technique (such as infrared or radiant heat) and the material composition.

The bumps 202 assume various shapes after attaching the chip to the substrate, influenced by the forces of surface tension during the reflow process. During the assembly and reflow process, and especially during temperature cycling in device operation or device testing (−40 to +125° C.), these bumps come under severe thermomechanical stress due to the large CTE discrepancy between silicon and the substrate. It is, consequently, essential to distribute, by capillary forces, a polymeric precursor 205 between the bumps. After polymerization (curing), "underfill" 205 provides some stress relief.

Underfill polymer 205 forms fillet 206 at the chip edges 201a by protruding beyond the chip periphery/edge 201a and spreading some distance 206a to the contour 206b of the fillet. It has been known for a long time that these fillets 206 are exposed to high stress concentrations due to the nature of edge 201a and corners 201c of chip 201; see, for example, K. G. Heinen, "Die Attach Reliability Prediction", 1$^{st}$ Internat. SAMPE Electronics Conf., pp.264–274, 1987. It is, therefore, a frequent phenomenon that cracks 207 originate at the interface of fillet 206 with the edge 201a or the corner 201c of chip 201. These nascent cracks 207 tend to propagate through the fillet into the substrate material 203.

According to the invention, a metal layer 208 is placed on the surface 203a of substrate 203. This layer is shaped as a band around the chip periphery/edge 201a, surrounding the whole chip 201. Band 208 has an inner edge 208a near the chip periphery 201a and an outer edge 208b near the contour of the polymer protrusion/fillet 206. As defined herein, the term "near" is to be understood in a geometrical sense with the following connotation: "near the chip periphery" means "extending some distance beyond the chip periphery (201a) as measured from the ring center line (208c)"; and "near the contour of the polymer protrusion" means "extending some distance beyond the polymer protrusion (206b) as measured from the ring center line (208c)". The distance itself is a function of the underfill material and the size of the meniscus of the fillet for the device type.

Figure 3:
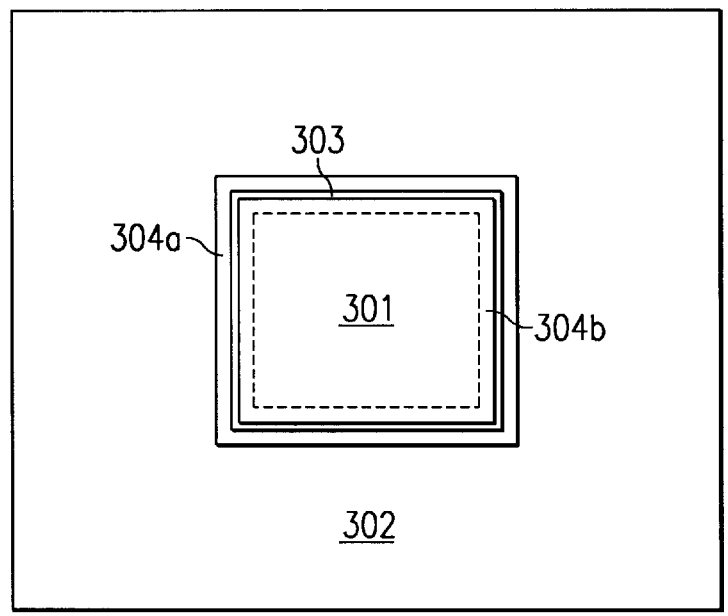
FIG. 3 is a schematic top view of an IC chip attached to a substrate and surrounded by the underfill fillet and the metal guard ring.

FIG. 3 is a schematic top view of a chip 301 flipped on a substrate 302 with the underfill fillet 303 protruding around the whole chip periphery. The position of the metal guard ring is visible by the portion 304a outside the fillet 303, and by an X-ray view 304b under chip and fillet.

Referring to FIGS. 2 and 3, the metal layer 208 is made of copper, aluminum, nickel or an alloy thereof, aiming at maximum mechanical toughness. A preferred metal is copper with a flash of nickel and gold. The thickness of layer 208 is in the range from 10 to 50 $\mu$m. Preferably, metal layer 208 is fabricated together with terminal metallization 203b, so that no extra process step is necessary. Metal band 208 is electrically floating, not at any specified bias.

The metal band 208 serves a guard ring to stop any nascent crack 207 that may propagate in polymer protrusion/fillet 206. Reliability tests have shown that this crack-stopping capability of metal guard ring 208, due to its toughness, is a very effective mechanism to extend the lifetime of flawless underfill operation. Some instances have been observed where the crack was deflected sidewise and caused (harmless) debonding of the fillet/guard ring interface and lost its energy in that process.

Figure 4:
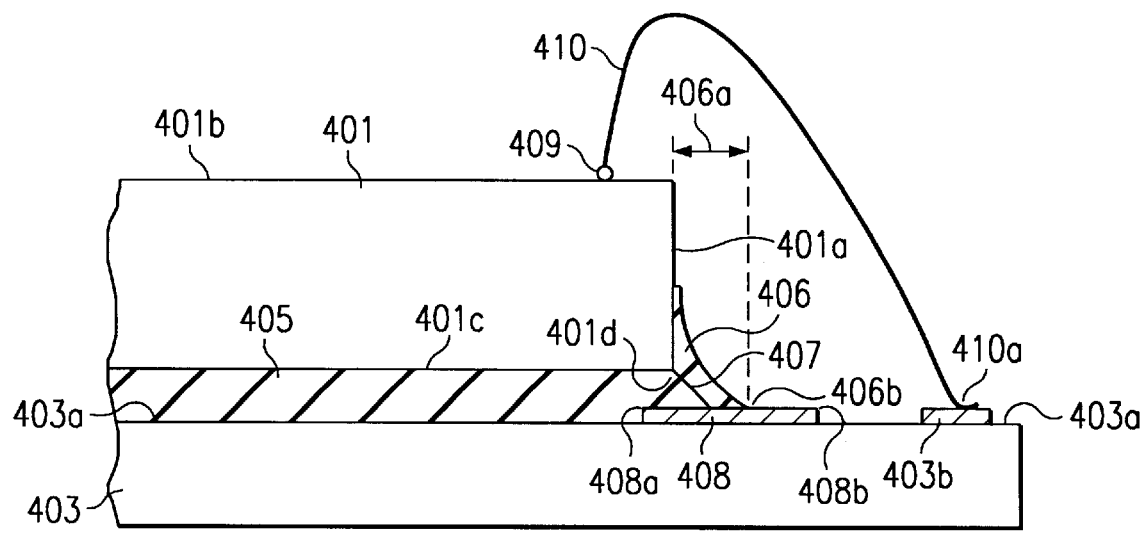
FIG. 4 is a schematic cross section of a portion of an IC chip, assembled with its passive surface on a substrate having a metal layer on its surface, structured as a guard ring to stop any crack through the fillet of the chip attach adhesive.

FIG. 4 illustrates the second embodiment of the invention. FIG. 4 shows a simplified and schematic cross section of a portion of an IC chip 401, specifically the end portion of the chip with the chip edge (periphery) 401a. Chip 401, usually silicon, has an "active" surface 401b including the IC and the contact pads, and a "passive" surface 401c opposite the IC surface. A polymeric adhesive 405 glues the passive chip surface 401c to substrate 403. The adhesive 405 may be an epoxy- or polyimide-based polymer, which is applied in low viscosity constitution and later "cured" (polymerized, hardened). Adhesive polymer 405 forms a fillet 406.

Adhesive polymer 405 forms a fillet 406 at the chip edges 401a by protruding beyond the chip periphery/edge 401a and spreading some distance 406a to the contour 406b of the fillet. It has been known for a long time that these fillets 406 are exposed to high stress concentrations due to the nature of edge 401*a* and corners 401*d* of chip 401; see, for example, the publication by K. G. Heinen quoted above. It is, therefore, a frequent phenomenon that cracks 407 originate at the interface of fillet 406 with the edge 401*a* or the corner 401*d* of chip 401. These nascent cracks 407 tend to propagate through the fillet into the substrate material 403.

According to the invention, a metal layer 408 is placed on the surface 403*a* of substrate 403. This layer is shaped as, a band around the chip periphery/edge 401*a*, surrounding the whole chip 401. Band 408 has an inner edge 408*a* near the chip periphery 401*a* and an outer edge 408*b* near the contour 406*b* of the polymer protrusion/fillet 406, or some distance beyond. The metal layer 408 is made of copper, aluminum, nickel or an alloy thereof, aiming at maximum mechanical toughness. A preferred metal is copper with a flash of nickel and gold. The thickness of layer 408 is in the range from 10 to 50 $\mu$m. Preferably, metal layer 408 is fabricated together with terminal metallization 403*b*, so that no extra process step is necessary.

The metal band 408 serves a guard ring to stop any nascent crack 407 that may propagate in polymer protrusion/fillet 406. Reliability tests have shown that this crack-stopping capability of metal guard ring 408, due to its toughness, is a very effective mechanism to extend the lifetime of flawless chip attach operation.

In FIG. 4, the IC surface 401*b* is facing away from the substrate surface 403*a*. A bonding wire ball 409 is attached to each contact pad on the IC surface 401*b*, and a bonding wire 410 is spanned to the respective electrical terminal pad 403*b* on the substrate surface 403*a* and attached there by stitch bond 410*a*.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A semiconductor device comprising:
   a substrate of electrically insulating material, said substrate having a surface;
   an integrated circuit chip having a periphery and a surface, said chip surface mounted on said substrate surface to form an assembly;
   a layer of polymeric material between said substrate surface and said chip surface, said material protruding beyond said chip periphery and spreading some distance along said substrate surface; and
   a metal layer being electrically floating on said substrate surface, said layer shaped as a band around said chip periphery, said band having an inner edge near said chip periphery, and an outer edge near the contour of said polymer protrusion, whereby said metal band serves as a guard ring to stop any nascent crack that may propagate in said polymer protrusion.

2. The device according to claim 1 wherein said chip surface includes said integrated circuit, said mounting is provided by solder bumps, and said polymeric material is the bump underfill material.

3. The device according to claim 1 wherein said substrate is integral with patterned metal lines and terminals, serving as electrical interconnection and input/output ports.

4. The device according to claim 1 wherein said metal layer is made of copper, aluminum, nickel, or an alloy thereof, aiming at maximum mechanical toughness, and has a thickness in the range from about 10 to 50 $\mu$m.

5. The device according to claim 1 wherein said metal layer is fabricated together with the last of said substrate patterned metal lines, so that no extra process step is necessary.

* * * * *